US012635184B2

(12) United States Patent　(10) Patent No.: US 12,635,184 B2
Ikeda et al.　(45) Date of Patent: May 19, 2026

(54) SEMICONDUCTOR DEVICE

(71) Applicant: Magnolia White Corporation, Tokyo (JP)

(72) Inventors: Masanobu Ikeda, Tokyo (JP); Yoshitaka Ozeki, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 357 days.

(21) Appl. No.: 18/325,141

(22) Filed: May 30, 2023

(65) Prior Publication Data

US 2023/0395688 A1　Dec. 7, 2023

(30) Foreign Application Priority Data

Jun. 2, 2022　(JP) ................................. 2022-090332

(51) Int. Cl.
| | |
|---|---|
| *H01L 29/49* | (2006.01) |
| *H01L 29/45* | (2006.01) |
| *H10D 30/67* | (2025.01) |
| *H10D 64/62* | (2025.01) |
| *H10D 86/40* | (2025.01) |
| *H10D 86/60* | (2025.01) |

(Continued)

(52) U.S. Cl.
CPC ..... *H10D 30/6739* (2025.01); *H10D 30/6734* (2025.01); *H10D 30/6755* (2025.01); *H10D 64/62* (2025.01); *H10D 86/423* (2025.01); *H10D 86/60* (2025.01); *H10D 87/00* (2025.01); *H10W 20/4424* (2026.01)

(58) Field of Classification Search
CPC ............... H10D 30/6739; H10D 30/67; H10D 30/6734; H10D 30/6755; H10D 64/62; H10D 64/60; H10D 64/405; H10D 64/235; H10D 87/00; H10D 86/423; H10D 86/40; H10D 86/60; H10D 86/471; H01L 23/53233; H01L 23/532; H01L 23/66; H01L 23/528; H01L 23/5329; H10W 20/4424; H10W 20/44; H10W 20/20; H10W 20/40; H10W 20/023
See application file for complete search history.

(56) References Cited

U.S. PATENT DOCUMENTS

| | | | |
|---|---|---|---|
| 8,188,472 B2 * | 5/2012 | Park ................... | H10D 30/6715 |
| | | | 257/43 |
| 10,923,036 B2 * | 2/2021 | Lee ...................... | G09G 3/3275 |

(Continued)

FOREIGN PATENT DOCUMENTS

JP　2006-165528 A　6/2006

*Primary Examiner* — Nikolay K Yushin

(74) *Attorney, Agent, or Firm* — XSENSUS LLP

(57) ABSTRACT

A semiconductor device including a first gate electrode, a first gate insulating film in contact with the first gate electrode, an oxide semiconductor layer in contact with the first gate insulating film, and a source electrode and a drain electrode electrically connected to the semiconductor layer, wherein the first gate electrode, the source electrode, and the drain electrode are either an electrode consisting of copper (Cu) containing manganese (Mn), an electrode having a layered structure of layers containing copper and titanium (Ti), or an electrode having a layered structure of layers containing titanium and aluminum (Al), and the first gate electrode includes a different metal from the source electrode and drain electrode.

17 Claims, 6 Drawing Sheets

(51) Int. Cl.
    *H10D 87/00*         (2025.01)
    *H10W 20/44*       (2026.01)

(56)                   References Cited

U.S. PATENT DOCUMENTS

| | | | |
|---|---|---|---|
| 11,152,494 B2 * | 10/2021 | Koezuka ................ | H10D 99/00 |
| 2006/0113536 A1 | 6/2006 | Kumomi et al. | |
| 2008/0258141 A1 * | 10/2008 | Park ................... | H10D 30/6715 |
| | | | 257/E33.013 |
| 2018/0151125 A1 * | 5/2018 | Lee ...................... | G09G 3/3266 |
| 2020/0287026 A1 * | 9/2020 | Koezuka ............ | H10D 30/6755 |

* cited by examiner

FIG. 4

SEMICONDUCTOR DEVICE

CROSS-REFERENCE TO RELATED APPLICATION

This application claims the benefit of priority to Japanese Patent Application No. 2022-090332 filed on Jun. 2, 2022, the entire contents of which are incorporated herein by reference.

FIELD

An embodiment of the present invention relates to a semiconductor device and a display device. In particular, the present invention relates to a semiconductor device including an oxide semiconductor and a display device.

BACKGROUND

In recent years, semiconductor devices such as transistors and diodes have been used as a fine switching element of a driving circuit in display devices and personal computers. In particular, silicon-based semiconductor materials such as amorphous silicon have been used as transistors in accordance with the enlargement of the screen and high definition in display devices, but transistors using oxide semiconductor have been developed instead (see, for example, JP-A-2006-165528).

In order to increase the size and the definition of a display device, it is essential that the time (time constant) until the output voltage reaches a certain level at the time of turning on and off the transistor is short. In order to reduce the time required for the output voltage to reach a certain level, the on-state current of the transistor needs to be increased and the time constant of wiring connected to the output terminal of the transistor needs to be reduced, that is, wiring capacitance needs to be reduced.

However, an oxide semiconductor is reduced by water and hydrogen from an insulating film and the like used in transistors by a heat treatment (annealing) process in a transistor manufacturing process using an oxide semiconductor, and thus behaves like conductors instead of semiconductors.

Furthermore, the display device size increases wiring used for the display device, and the resistance of wiring cannot be ignored. Therefore, it is essential to use a low resistance wiring for display devices. However, metals that can be used for low resistance wiring tend to be susceptible to oxidation, thus requiring an adequate reduction treatment of the metals to lower wiring resistance. In the reduction treatment, a reducing gas is used, but when hydrogen or the like from the reducing gas diffuses and reaches the oxide semiconductor, the oxide semiconductor exhibits properties similar to conductors. The use of a low resistance wiring requires the introduction of materials that have not been used in transistor manufacturing so far, which requires expensive capital expenditures.

SUMMARY

A semiconductor device according to an embodiment of the present invention includes a first gate electrode, a first gate insulating film in contact with the first gate electrode, an oxide semiconductor layer in contact with the first gate insulating film, and a source electrode and a drain electrode electrically connected to the semiconductor layer, wherein the first gate electrode, the source electrode, and the drain electrode are either an electrode consisting of copper (Cu) containing manganese (Mn), an electrode having a layered structure of layers containing copper and titanium (Ti), or an electrode having a layered structure of layers containing titanium and aluminum (Al), and the first gate electrode comprises a laminated structure from the source electrode and drain electrode.

BRIEF DESCRIPTION OF DRAWINGS

FIG. 4 is a schematic cross-sectional view of a semiconductor device according to an embodiment of the present invention.

DESCRIPTION OF EMBODIMENTS

Figure 1:
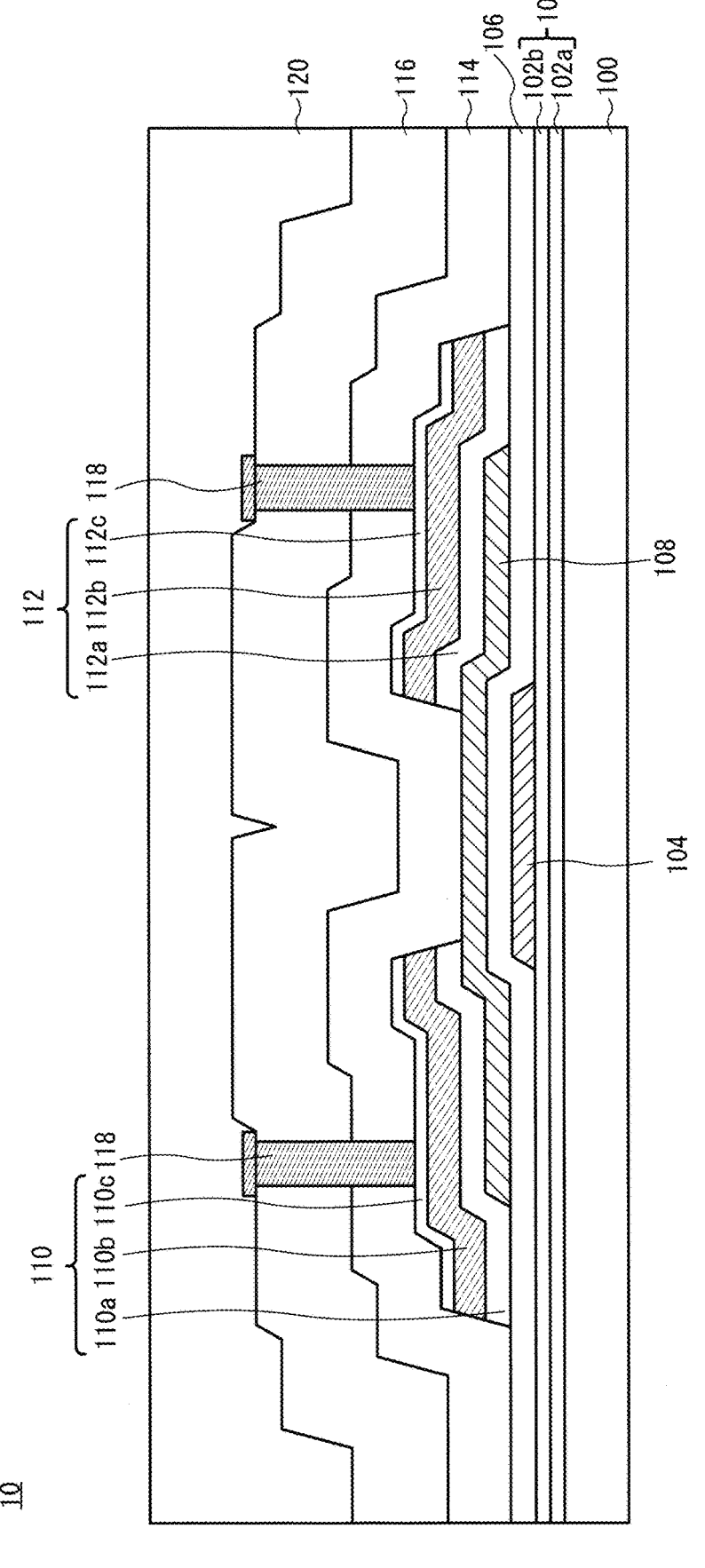
FIG. 1 is a schematic cross-sectional view of a semiconductor device according to an embodiment of the present invention.

Hereinafter, embodiments according to the present invention will be described with reference to the drawings. Each of the embodiments is merely an example, and those that can be easily conceived by a person skilled in the art by appropriately changes while keeping the gist of the invention are naturally included in the scope of the present invention. In order to make the description clearer, the drawings may schematically show the width, thickness, shape, and the like of each part in comparison with an actual embodiment. However, the illustrated shapes are merely examples, and do not limit the interpretation of the present invention.

In the present specification, the phrase "a includes A, B, or C," "a includes any of A, B, and C," "a includes one selected from a group consisting of A, B, and C," and the like does not exclude the case where a includes a plurality of combinations of A to C unless otherwise indicated. Furthermore, these expressions do not exclude the case where a includes other elements.

In the present specification, although the phrases "on" or "above" or "under" or "below" are used for convenience of explanation, in principle, a substrate on which a structure is formed is used as a reference, and a direction from the substrate to the structure is defined as "on" or "above". Conversely, a direction from the structure to the substrate is defined as "under" or "below". Therefore, in the expression "light-emitting element on a substrate", a substrate side surface of the light-emitting element is a lower surface, and the other side surface thereof is an upper surface. In addition, in the expression "light-emitting element on a substrate", only the vertical relationship between the substrate and the light-emitting element is described, and another member may be arranged between the substrate and the light-emitting element. Furthermore, the phrases "on" or "above" or "under" or "below" refer to the order in which a plurality of layers is stacked, and may not be in a positional relationship overlapping in a plan view.

In the present specification, the term "a structure is exposed from another structure" means that a portion of a structure is not covered by another structure, and the portion not covered by this other structure also includes an aspect covered by yet another structure.

In the present specification, when a single film is processed to form a plurality of films, the plurality of films may have different functions and roles. However, the plurality of films is derived from films formed as the same layer in the same process, and have the same layer structure and the same material. Thus, in the present specification, the plurality of films is defined as being present in the same layer.

In the present invention, the term "display device" broadly includes a device that displays an image using a display element, and may include not only a display panel and a display module but also a device to which other optical members (e.g., a polarizing member, a backlight, a touch panel, or the like) are attached.

The following embodiments can be combined with each other if there is no technical inconsistency.

First Embodiment

An outline of a semiconductor device according to an embodiment of the present invention is described with reference to FIG. 1. The semiconductor device 10 is used for respective pixels and a driving circuit in each display device, which are a liquid crystal display device, a display unit using an organic EL (organic electro-luminescence) element, a self-luminous display device using a self-light emitting element such as a micro LED device and a quantum dot, or a reflective display device such as an electronic paper.

However, the semiconductor device according to the present invention is not limited to those used for display devices, and may be used for integrated circuits (Integrated Circuit: IC) such as a micro-processing unit (Micro-Processing Unit: MPU). The semiconductor device 10 of the first embodiment is a semiconductor device in which an oxide semiconductor is used as channels. In the first embodiment, a transistor is exemplified as a semiconductor device, but the semiconductor device according to the present invention is not limited to a transistor.

[Semiconductor Device 10]

FIG. 1 is a cross-sectional view illustrating an outline of a semiconductor device according to an embodiment of the present invention. As shown in FIG. 1, the semiconductor device 10 includes a substrate 100, a base film 102, a first gate electrode 104, a first gate insulating film 106, an oxide semiconductor layer 108, a source electrode 110, and a drain electrode 112, a first insulating film 114, and a second insulating film 116.

The base film 102 is arranged on the substrate 100. The base film 102 may have a layered structure, and as shown in FIG. 1, may have a layered structure on which a second base film 102b is arranged on a first base film 102a.

The first gate electrode 104 is arranged on the base film 102. The first gate electrode 104 may have a layered structure. As will be described later, the first gate electrode 104 is formed of layers using a hydrogen-absorbing alloy, and further, a low resistance metal is used.

The first gate insulating film 106 is arranged on the first gate electrode 104 and on the base film 102 exposed from the first gate electrode 104. The first gate insulating film 106 is in contact with the first gate electrode 104 and the base film 102.

Oxide semiconductor layers 108 are arranged on the first gate insulating film 106 and are in contact with the first gate insulating film 106. Oxide semiconductor layers 108 are used for channels of the semiconductor device 10.

The source electrode 110 and the drain-electrode 112 are arranged on the oxide semiconductor layer 108 and the first gate insulating film 106 exposed from the oxide semiconductor layer 108. The source electrode 110 and the drain-electrode 112 may be electrically connected to or in direct contact with the oxide semiconductor layer 108. The source electrode 110 and the drain-electrode 112 have a layered structure of two or more layers. FIG. 1 shows an embodiment in which the source electrode 110 and the drain-electrode 112 each have a layered structure of three layers. As will be described in detail later, the source electrode 110 and the drain electrode 112 are formed of a layer using a hydrogen-absorbing alloy. Further, a low resistance metallic material is used for the source electrode 110 and the drain electrode 112.

The first insulating film 114 is arranged on the source electrode 110 and the drain electrode 112, on the oxide semiconductor layer 108 exposed from the source electrode 110 and the drain electrode 112, and on the first gate insulating film 106 exposed from the source electrode 110 and the drain electrode 112. Further, the first insulating film 114 is arranged in contact with the oxide semiconductor layers 108 and the source electrode 110 and the drain electrode 112. The first insulating film 114 may be provided with an opening in which a wiring layer 118 connected to the source electrode 110 and the drain electrode 112 is arranged.

The second insulating film 116 is arranged on the first insulating film 114. The second insulating film 116 is provided to be in contact with the first insulating film 114. The second insulating film 116 may be provided with an opening in which the wiring layer 118 connected to the source electrode 110 and the drain electrode 112 is arranged.

The semiconductor device 10 may have a planarization film 120 as an optional configuration. The planarization film 120 may be arranged on the second insulating film 116 and may be provided in contact with the second insulating film 116 and the wiring layer 118.

Although the semiconductor device 10 shown in FIG. 1 is structured by using a bottom-gate transistor, a top-gate transistor may also be used.

[Each Component Configuring Semiconductor Device 10]

A substrate having a light transmittance with respect to visible-light is used as the substrate 100. A flexible substrate or a rigid substrate is used as the substrate 100. Specifically, a polyimide substrate, an acryl substrate, a siloxane substrate, a fluororesin substrate, or the like can be used for a flexible substrate. A rigid substrate may be a glass substrate, a quartz substrate, a sapphire substrate, or the like. Further, a substrate having a lower light transmittance can be used for the substrate 100, and for example, a silicon substrate, a silicon carbide substrate, a semiconductor substrate such as a compound semiconductor substrate, or a conductive substrate such as a stainless-steel substrate can be used.

An inorganic insulator such as silicon nitride, silicon oxide, silicon nitride oxide, or silicon oxynitride can be used as the base film 102. As shown in FIG. 1, when the base film 102 is composed of a plurality of layers, the same material can be used for the first base film 102a and the second base film 102b. For example, silicon oxide may be used for the first base film 102a and the second base film 102b, and the film density of the second base film 102b closer to the oxide semiconductor layer 108 may be larger than the film density of the first base film 102a. Further, the material used for the first base film 102a and the material used for the second base film 102b may be different from each other. For example, the film density of the first base film 102a can be made larger than the film density of the second base film 102b by using silicon nitride for the first base film 102a and silicon oxide for the second base film 102b. The base film 102 has a function of preventing impurities from the substrate 100 from diffusing into the semiconductor device 10, but it is also possible to reduce the effects of water/hydrogen on the oxide semiconductor layer 108 by having the above-described film-density relationship.

A hydrogen-absorbing alloy can be used as the first gate electrode 104. Specifically, examples of the hydrogen-absorbing alloy used in the first gate electrode 104 include titanium (Ti), zirconium (Zr), palladium (Pd), magnesium (Mg), manganese (Mn), and an alloy containing at least one of these metals. Since these metals have a small capacity to release the absorbed hydrogen, the hydrogen absorbed in the first gate electrode 104 can be prevented from diffusing into the layer or the film in contact with the first gate electrode 104. More specifically, examples of the hydrogen-absorbing alloy used in the first gate electrode 104 include a AB2 hydrogen-absorbing alloy, a AB1 hydrogen-absorbing alloy, a titanium-iron (Ti—Fe)-based hydrogen-absorbing alloy, a vanadium (V)-based hydrogen-absorbing alloy, a magnesium (Mg)-based hydrogen-absorbing alloy, a palladium (Pd)-based hydrogen-absorbing alloy, and a calcium (Ca)-based hydrogen-absorbing alloy. Among these alloys, at least one of a AB2 type hydrogen-absorbing alloy, a AB1 type hydrogen-absorbing alloy, and a Mg alloy can be preferably used for the first gate electrode 104. More preferably, the first gate electrode 104 may be an electrode based on at least one of an alloy containing a transition metal such as Ti, Mn, Zr, Ni, an alloy containing a transition element (Ni, cobalt (Co), aluminum (Al), or the like) 5 catalytically effective against niobium (Nb)1, and an alloy containing Mg. These alloys are easily applied to the manufacturing process of the semiconductor device from the viewpoint of ease of processing and the like, and are preferably used for the first gate electrode 104. Furthermore, from the viewpoint of ease of processing of these alloys, the thickness of the first gate electrode 104 is preferably not less than 5 nm and not more than 60 nm.

It is further preferred that among the electrodes based on at least one of the above-mentioned alloys, the first gate electrode 104 may be any of the electrode composed of copper (Cu) with Mn, the electrode comprising layered structure of a layer comprising Cu and a layer comprising Ti, and the electrode comprising a layered structure of a layer comprising Ti and a layer comprising Al. Specifically, the layered structure comprising a layer containing Cu and a layer containing Ti can be a two-layer layered structure in which Ti or titanium nitride (TiN) and Cu are laminated (Cu/Ti, Cu/TiN or the like). Specifically, the layered structure comprising a layer containing Cu and a layer containing Al can be a three-layer structure in which Ti or TiN, and Al are sequentially laminated or a five-layer structure (Ti/Al/Ti, TiN/Al/TiN, TiN/Ti/Al/TiN/Ti or the like). When layers using Ti and TiN are laminated, it is preferable to use a layer containing Ti in a layer in contact with or closer to the oxide semiconductor layer 108.

As described above, in the first gate electrode 104, by using the hydrogen-absorbing alloy, the hydrogen discharged from the layer in contact with the first gate electrode 104 can be absorbed by the heat treatment in the manufacturing process of the semiconductor device 10, and the diffusion of the hydrogen to the oxide semiconductor layer 108 can be suppressed.

The first gate electrode 104 may also have a barrier-metal function by being composed of the structure mentioned above using a hydrogen-absorbing alloy, especially copper (Cu) containing Mn. Further, when the heat treatment in the manufacturing process of the semiconductor device is performed on the first gate electrode 104, the first gate electrode 104 has a layered structure (Ti/Al/Ti or the like) sandwiching a layer containing Al with a layer containing Ti, so that generation of whiskers of Al can be suppressed and stress migration of the first gate electrode 104 can be reduced.

Further, manganese oxide (MnxOy) is formed between the first gate electrode 104 and the first gate insulating film 106 when the first 104 is made of Cu containing Mn and the first gate insulating film 106 in contact with the first gate electrode 104 described later is made of silicon oxide. Accordingly, since the first gate electrode 104 can suppress thermal spreading of Cu to the first gate insulating film 106, it is preferable that the first gate electrode is composed of copper (Cu) containing Mn. Here, x and y denote natural numbers.

As described above, the first gate electrode 104 has a configuration in which a low resistance metal is used for the hydrogen-absorbing alloy, and thus the time-constant is further improved.

The first gate insulating film 106 can be made of an inorganic insulating material containing silicon. Since the first gate insulating film 106 is in contact with the oxide semiconductor layer 108, it is preferable to use silicon oxide for the first gate insulating film 106, and further SiO2 is preferable. By using silicon oxide, the first gate insulating film 106 can form manganese oxide with Mn used for the first gate electrode 104 as described above, thereby suppressing thermal spreading of Cu.

The oxide semiconductor layer 108 may be formed of a metal-oxide having semiconducting properties. For example, an oxide semiconductor containing indium (In), gallium (Ga), zinc (Zn), and oxygen (O), and an oxide semiconductor containing indium (In), tin (Sn), zinc (Zn), and oxygen (O) can be used. The oxide semiconductor containing indium (In), tin (Sn), zinc (Zn), and oxygen (O) are more easily reduced than the oxide semiconductor containing indium (In), gallium (Ga), zinc (Zn), and oxygen (O), and embodiments of the present invention can be more preferably used. The oxide semiconductor layer 108 may be amorphous or crystalline. The oxide semiconductor layer 108 may be mixed phases of amorphous and crystalline.

The source electrode 110 and the drain electrode 112 may be formed of the same material and configuration as those of the first gate electrode 104. However, the source electrode 110 and the drain-electrode 112 are configured to include a material other than the first gate electrode 104. For example, if the first gate electrode 104 has a layered structure of a layer containing Cu and a layer containing Ti, the source electrode 110 and the drain electrode 112 have a layered structure of a layer containing Ti and a layer containing Al.

Since the source electrode 110 and the drain electrode 112 tend to be processed finer than the first gate electrode 104, they are preferably formed of layers including a hydrogen-absorbing alloy that can be processed by a dry process. Therefore, the source electrode 110 and the drain electrode 112 preferably have a layered structure of a layer containing Ti and a layer containing Al, and have a layered structure of two or more layers.

Since the source electrode 110 and the drain electrode 112 are connected to the oxide semiconductor layer 108, they are composed of at least layers 110a, 112a closest to the oxide semiconductor layer 108, and layers 110c, 112c farthest from the oxide semiconductor layer 108 in the layered structure. Regarding this composition, it is preferable that the thickness of the layers 110a, 112a closest to the oxide semiconductor layer 108 is larger than the thickness of the layers 110c, 112c farthest from the oxide semiconductor layer 108. For example, when the source electrode 110 and the drain electrode 112 have a layered structure in the order of the layers 110c, 112c containing the first Ti/the layers 110b, 112b containing Al/the layers 110a, 112a containing the second Ti, and the layers 110a, 112a containing the second Ti are closer or in contact with the oxide semiconductor layer 108 than other layers, the thickness of the layers 110a, 112a containing the second Ti is greater than that of the layers 110c, 112c containing the first Ti.

When the source electrode 110 and the drain electrode 112 have two or more layers of the layered structure, it is preferable that the source electrode 110 and the source electrode 112 further have a layer between the layer 110a, 112a closest to the oxide semiconductor layer 108 and the layer 110c, 112c farthest from the oxide semiconductor layer 108. The layered structure in which the source electrode 110 and drain electrode 112 of have two or more layers is a structure in which a plurality of layers containing Ti sandwich a layer containing Al. The layers 110a, 112a closest to the oxide semiconductor layer 108 and the layers 110c, 112c farthest from the oxide semiconductor layer 108 have Ti, and the layers 110b, 112b between the layers 110a, 112a closest to the oxide semiconductor layer 108 and the layers 110c, 112c farthest from the oxide semiconductor layer 108 preferably have Al.

Further, the layer 110a, 112a closest to oxide semiconductor layer 108 indicates one or more layers between the layer containing Al and the oxide semiconductor layer 108, and the layers 110c, 112c farthest from oxide semiconductor layer 108 indicates one or more layers located opposite the layers 110a, 112a closest to the oxide semiconductor layer 108 with respect to the layer containing Al. For example, when the source electrode 110 and the drain electrode 112 have a layered structure in the order of the layer containing the first TiN/the layer containing the first Ti/the layer containing Al/the layer containing the second TiN/the layer containing the second Ti, and the layer containing the second Ti is closer or in contact with the oxide semiconductor layer than other layers, the layers 110a, 112a closest to the oxide semiconductor layer 108 indicate the layer containing the second TiN/the layer containing the second Ti, and the layers 110c, 112c farthest from the oxide semiconductor layer 108 indicate the layer containing the first TiN/the layer containing the first Ti. Thus, the thickness of the layer containing the second TiN and the layer containing the second Ti is greater than the thickness of the layer containing the first TiN and the layer containing the first Ti. As described above, the thickness of the layers 110a, 112a closest to the oxide semiconductor layer 108 is larger than the thickness of the layers 110c, 112c farthest from the oxide semiconductor layer 108, which further increases the hydrogen absorption effect of the source electrode 110 and drain electrode 112.

The first insulating film 114 and the second insulating film 116 may be made of an inorganic insulating material such as silicon oxide. Silicon oxide is preferably used as the first insulating film 114 and the second insulating film 116. Further, the first insulating film 114 preferably has a function of suppressing the diffusion of hydrogen/water to the oxide semiconductor layers 108. Further, the film density of the first insulating film 114 is greater than the film density of the second insulating film 116. However, when the film density of the second insulating film 116 is low, water or the like is absorbed and the relative dielectric constant is increased, so that the second insulating film 116 needs to have a sufficiently high film density. Therefore, specifically, the film density of the first insulating film 114 is preferably in the range of 2.00 g/cm³ to 2.15 g/cm³, and the film density of the second insulating film 116 is preferably in the range of 1.95 g/cm³ to 2.10 g/cm³.

A conductive oxide semiconductor such as ITO (indium tin oxide), IGO (indium gallium oxide), IZO (indium zinc oxide), or GZO (zinc oxide doped with gallium as a dopant) may be used as the wiring layer 118. The wiring layer 118 may be formed of a common metallic material. For example, aluminum (Al), titanium (Ti), chromium (Cr), cobalt (Co), nickel (Ni), molybdenum (Mo), hafnium (Hf), tantalum (Ta), tungsten (W), bismuth (Bi), silver (Ag), and alloys or compounds thereof may be used as these members.

The planarization film 120 may be formed of an organic insulator. Examples of the organic insulator include polymer materials such as epoxy resins, acrylic resins, polyimides, polyamides, polyesters, polycarbonates, and polysiloxanes. The planarization film 120 may include a layered structure of the layer including the organic insulator and the layer including the inorganic insulator. Examples of the inorganic insulator include an inorganic insulator containing silicon such as silicon oxide, silicon nitride, silicon nitride oxide, and silicon oxynitride.

[Electrode Pad]

Figure 2:
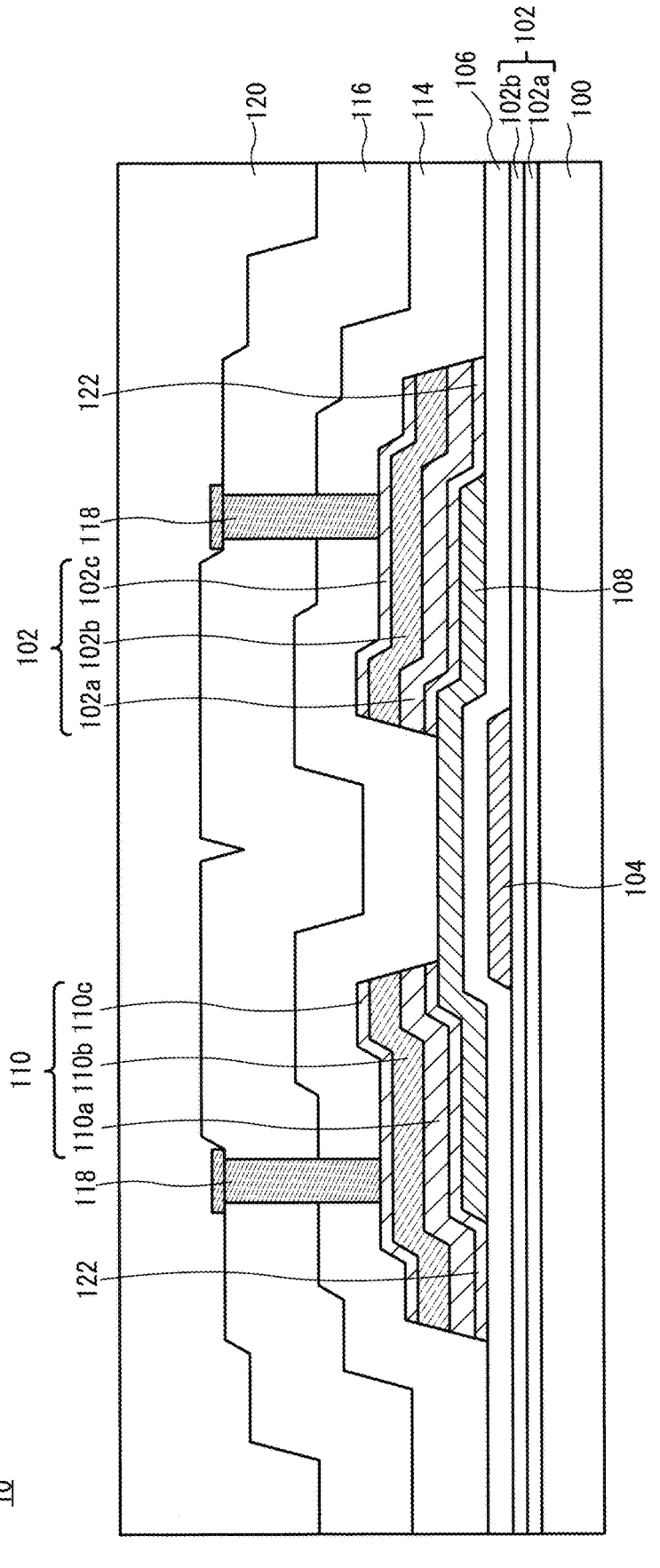
FIG. 2 is a schematic cross-sectional view of a semiconductor device according to an embodiment of the present invention.

Referring to FIG. 2, a modification of the semiconductor device 10 will be described. A difference from the semiconductor device 10 shown in FIG. 1 is that electrode pads 122 are arranged between the oxide semiconductor layer 108, the source electrode 110, and the drain electrode 112, respectively. Configurations that are the same as or similar to those of the semiconductor device 10 illustrated in FIG. 1 may be omitted.

FIG. 2 is a cross-sectional view illustrating an outline of a semiconductor device according to an embodiment of the present invention. As shown in FIG. 2, the electrode pad 122 is arranged on the oxide semiconductor layer 108 and the first gate insulating film 106 exposed from the oxide semiconductor layer 108. The electrode pad 122 is connected in direct contact with the oxide semiconductor layer 108. Further, the electrode pad 122 is in contact with the source electrode 110 and the drain electrode 112, respectively. The thickness of the electrode pad 122 is preferably smaller than the thickness of the source electrode 110 and the drain electrode 112.

The electrode pad 122 is formed of a layer using a hydrogen-absorbing alloy. The electrode pad 122 may be formed of a material similar to that of the first gate electrode 104, the source electrode 110, and the drain electrode 112. The electrode pad 122 preferably contains Ti because it is arranged between the source electrode 110 and the drain electrode 112 and the oxide semiconductor layer 108, respectively. Further, the electrode pad 122 preferably has a single-layer structure of a layer containing Ti or TiN, or a layered structure of a layer containing TiN/a layer containing Ti. However, when the electrode pad 122 has a layered structure, the layer containing Ti is arranged so as to be in contact with the oxide semiconductor layer 108. At this time, the source electrode 110 and the drain electrode 112 preferably contain Ti and Al, and preferably have a layered structure with a plurality of layers containing Ti sandwiching a layer containing Al, as described above.

As described above, in the semiconductor device 10 according to the embodiment of the present invention, the oxide semiconductor layer 108 is used for the channels, and the hydrogen absorbing alloy is used for the first gate electrode 104, the source electrode 110, and the drain electrode 112 connected to oxide semiconductor layer 108, so that the hydrogen diffusions caused by the heat treatment process can be suppressed. As a result, the semiconductor device 10 has a large on-off ratio and a large on-current transistor property. In addition, the first gate electrode 104, the source-electrode 110, and the drain electrode 112 are made of a low resistance metal in addition to a hydrogen absorbing alloy. In particular, selecting Ti, and Cu of the hydrogen absorbing alloy used for the electrode may provide the semiconductor device 10 that does not require new capital expenditure because no new material is required to be introduced.

Further, the oxide semiconductor layer 108 can be prevented from diffusing hydrogen, water, or the like by disposing the high-density first insulating film 114 using silicon oxide and the second insulating film 116 having a density lower than a density of the first insulating film 114 on the oxide semiconductor layer 108.

As described above, according to the present embodiment, the semiconductor device 10 in which the on-state current of the transistor is improved is provided. According to the present embodiment, the semiconductor device 10 is provided in which the time-constant of wiring from the output terminal of the transistor is reduced. Further, the on-state current of the transistor is improved and the time-constant of wiring from the output terminal of the transistor is reduced, whereby the transistor performance is improved and degradation is suppressed. This provides a reliable semiconductor device 10.

Second Embodiment

In the present embodiment, an outline of the semiconductor device 20 according to one embodiment of the present invention will be described. One of the differences between the semiconductor device 20 and the semiconductor device 10 of the first embodiment is that the semiconductor device 20 is of the dual-gate type. Descriptions of the same or similar configurations as those of the first embodiment may be omitted.

Figure 3:
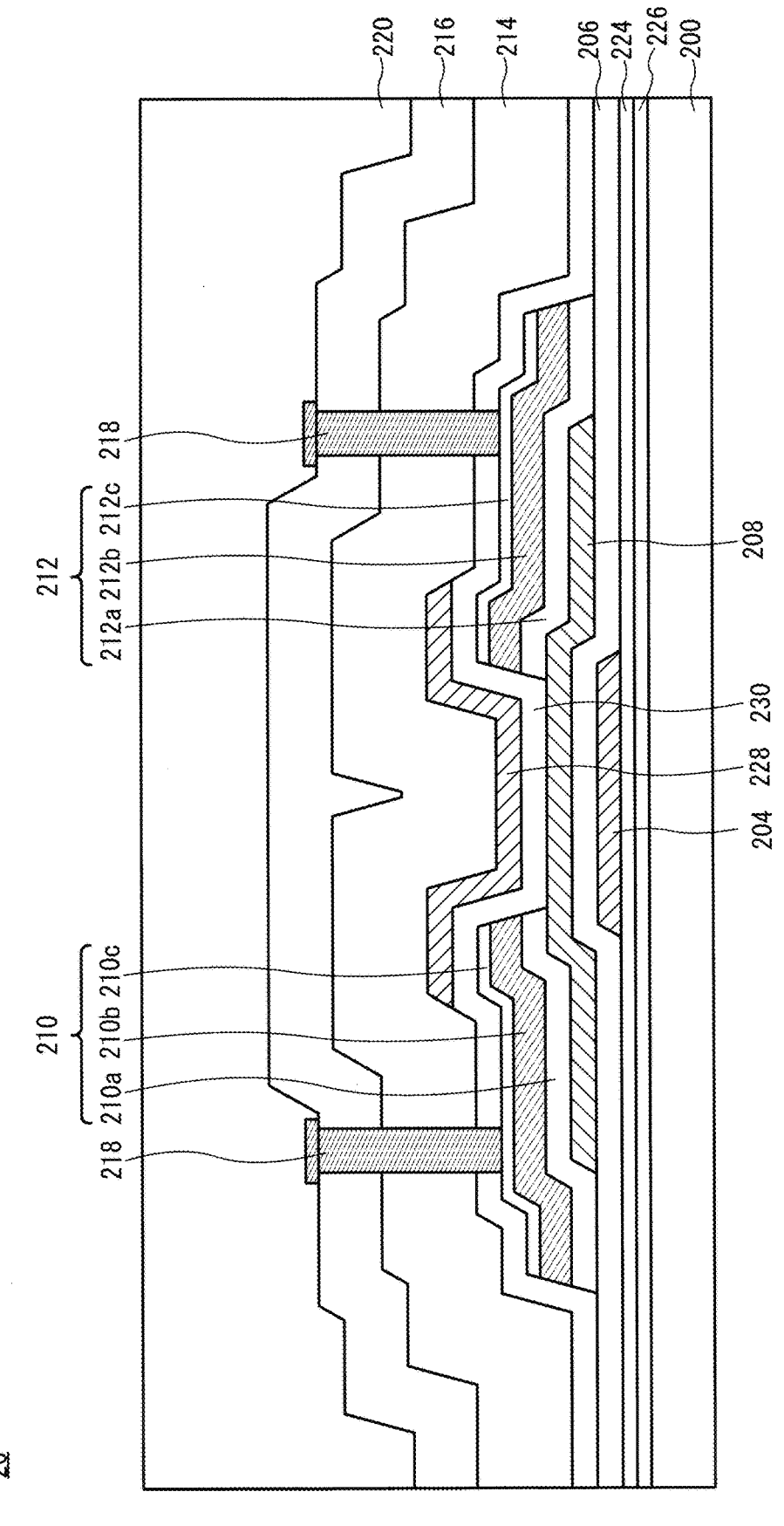
FIG. 3 is a schematic cross-sectional view of a semiconductor device according to an embodiment of the present invention.

FIG. 3 is a cross-sectional view schematically illustrating a semiconductor device 20 according to an embodiment of the present invention. As shown in FIG. 3, the semiconductor device 20 has a substrate 200, a first insulating film 214, a second insulating film 216, a third insulating film 224, a fourth insulating film 226, an oxide semiconductor 208, a first gate electrode 204, a first gate insulating film 206, a second gate electrode 228, and a second gate insulating film 230.

The second gate insulating film 230 is arranged on the source electrode 210 and the drain electrode 212, on the oxide semiconductor layer 208 exposed from the source electrode 210 and the drain electrode 212, and on the first gate insulating film 206 exposed from the source electrode 210 and the drain electrode 212. Further, the second gate insulating film 230 is arranged in contact with the oxide semiconductor layer 208 and the source electrode 210 and the drain electrode 212. The second gate insulating film 230 may be provided with openings in which the wiring layers 218 connected to the source electrode 210 and the drain electrode 212 are arranged. The second gate insulating film 230 may be formed of the same material/structure as the first gate insulating film 206.

The second gate electrode 228 is arranged so as to be sandwiched between the first gate electrode 204 and the oxide semiconductor layer 208. The second gate electrode 228 is arranged on the second gate insulating film 230 and overlaps the first gate electrode 204, the first gate insulating film 206, the oxide semiconductor layer 208, and the second gate insulating film 230. The second gate electrode includes a material that differs from the source electrode 210 and the drain electrode 212. The second gate electrode and the first gate electrode may be made of different materials, but preferably the same material is used. Therefore, the second gate electrode 228 may be made of a material or a structure similar to that of the first gate electrode 204.

Further, the third insulating film 224 and the fourth insulating film 226 may be provided on the substrate 200. The third insulating film 224 is arranged on the fourth insulating film 226 and is in contact with the first gate electrode 204 and the first gate insulating film 206. Further, the fourth insulating film 226 is arranged between the third insulating film 224 and the substrate 200 and is in contact with the third insulating film 224 and the substrate 200. The third insulating film 224 may be made of a material or structure similar to a material or structure of the second base film 202b, and the fourth insulating film 226 may be made of a material or structure similar to that of the first base film 202a.

Third Embodiment

In the present embodiment, an outline of a semiconductor device 30 according to one embodiment of the present invention will be described. One of the differences between the semiconductor device 30 and the semiconductor device 10 of the first embodiment is that a second transistor 30-2 is provided in addition to a first transistor 30-1 having an oxide semiconductor layer 308. Descriptions of the same or similar configurations as those of the first embodiment may be omitted.

[Semiconductor Device 30]

Figure 4:
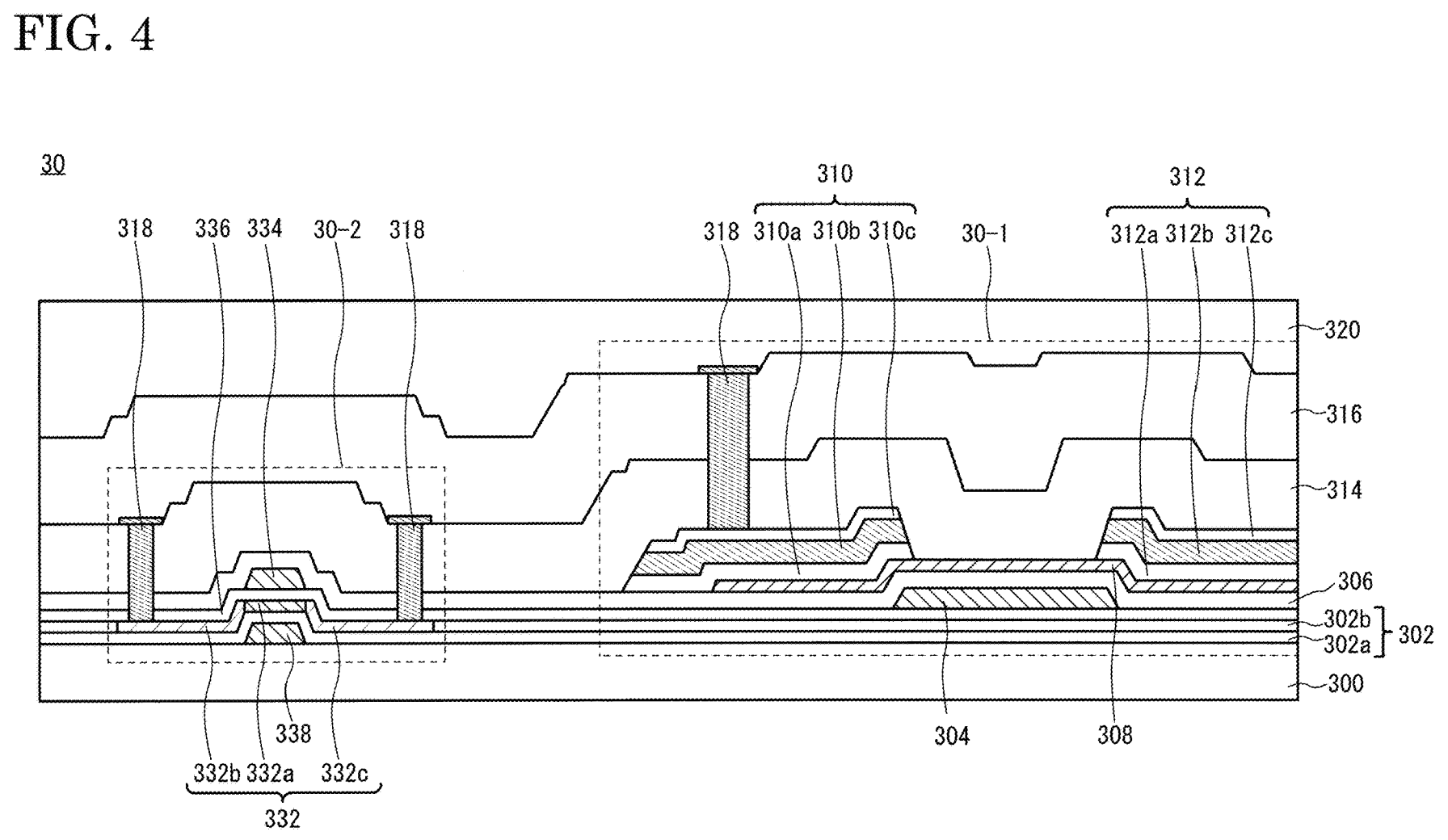

FIG. 4 is a cross-sectional view illustrating an outline of a semiconductor device according to an embodiment of the present invention. As shown in FIG. 4, the semiconductor device 30 has the first transistor 30-1 and the second transistor 30-2 which has a semiconductor layer 332 different from the oxide semiconductor layer 308 as a channel.

The second transistor 30-2 includes a base film 302, a semiconductor layer 332, a second gate electrode 334, a second gate insulating film 336, a first insulating film 314, and a second insulating film 316.

The semiconductor layer 332 is arranged on the base film 302. The second gate electrode 334 is arranged on the semiconductor layer 332 so as to overlap the semiconductor layer 332. A second gate insulating film 336 is arranged between the semiconductor layer 332 and the second gate electrode 334. Thus, the second gate electrode 334 is located on the second gate insulating film 336.

Further, the second gate electrode 334 is arranged on the same layer as the first gate electrode 304. Thus, the first gate electrode 304 is located on the second gate insulating film 336, similar to the second gate electrode 334. On the first gate electrode 304 and the second gate electrode 334, the first gate insulating film 306 is arranged so that the first gate insulating film 306 is arranged in contact with the second gate insulating film 336 exposed from the first gate electrode 304 and the second gate electrode 334.

Since the oxide semiconductor layer 308 is arranged on the first gate insulating film 306 and the semiconductor layer is arranged under the first gate insulating film 306, the oxide semiconductor layer 308 is arranged on an upper layer than the semiconductor layer 332.

The first insulating film 314 and the second insulating film 316 arranged on oxide semiconductor layers 308 are similarly provided on the semiconductor layer 332.

The second transistor 30-2 may have the light shielding layer 338 as an optional configuration. The light shielding layer 338 may be arranged between the substrate 300 and the base film 202. When the base film 202 is composed of a plurality of layers, the light shielding layer 338 may be provided so as to be sandwiched between the layers. the light shielding layer 338 can also be used as the lower electrode of the dual gate.

[Each Member Configuring Semiconductor Device 30]

The semiconductor layer 332 comprises silicon. The semiconductor layer 332 having silicon may include mono crystalline silicon, polycrystalline silicon, microcrystalline silicon, and amorphous silicon. Hereinafter, an exemplary embodiment in which the semiconductor layer 332 includes polycrystalline silicon will be described. The semiconductor layer 332 can also have the channel area 332a, the source area 332b, and the drain area 332c, and the source area 332b and drain area 332c are heavily doped as compared to the channel area 332a and are therefore highly conductive. Examples of the impurities include elements that impart p-type conductivity to the semiconductor layer 332, such as boron and aluminum, and elements that impart n-type conductivity to the semiconductor layer 332, such as phosphorus and nitrogen. The source area 332b and drain area 332c can be replaced by writing the second transistor 30-2.

As described above, inorganic insulating material such as silicon oxide can be used for the first insulating film 314, and SiO2 is preferably used. If the semiconductor layer 332 includes silicon (Si), the film density of the first insulating film 314 is preferably less than the film density of the second insulating film 316. However, the first insulating film 314 preferably has a film density of the first insulating film 314 in a range of not less than 2.05 g/cm$^3$ and not more than 2.15 g/cm$^3$ in order to suppress the diffusion of hydrogen, water, and the like into the oxide semiconductor layer 308.

The second insulating film 316 may be made of inorganic insulating material such as silicon nitride (SiNx). If the semiconductor layer 332 includes silicon (Si), it is preferable to use SiN for the second insulating film 316 because hydrogen can be supplied to the semiconductor layer 332. However, if the film density of the second insulating film 316 using SiNx is too high, the feed rate of hydrogen is reduced, and if the film density of the second insulating film 316 is too low, the film density of the second insulating film 316 is 2.60 g/cm$^3$ or more and 3.00 g/cm$^3$ or less. Furthermore, the film density of the second insulating film 316 is preferably greater than the film density of the first insulating film 314. Further, when SiNx is used for the second insulating film 316, it is preferable to form a film by plasma CVD using SiH4/N2 gases. The second insulating film 316 of SiN formed by the plasma CVD using SiH4/N2 gases is preferable because the content of hydrogen is small and the effect on the oxide semiconductor layers 308 is small.

When silicon oxide is used for the first insulating film 314 and the second insulating film 316, the film density of the first insulating film 314 may be greater than the film density of the second insulating film 316, the film density of the first insulating film 314 may be in the range of 2.00 g/cm$^3$ to 2.15 g/cm$^3$, and the film density of the second insulating film 316 may be in the range of 1.95 g/cm$^3$ to 2.10 g/cm$^3$.

The light shielding layer 338 may include metal such as chrome, and may have a function of blocking visible light.

As described above, the semiconductor device according to the embodiment of the present invention includes the first transistor 30-1 using the oxide semiconductor layer 308 as a channel and the second transistor 30-2 using the semiconductor layer 332 including silicon as a channel, the film density of the first insulating film 314 in contact with the oxide semiconductor layer 308 is smaller than the film density of the second insulating film 316 provided in contact with the first insulating film 314, and SiN is used for the second insulating film 316, whereby the supply of hydrogen to the semiconductor layer 332 is promoted and the hydrogen reaching to the semiconductor layer 308 is suppressed. As a result, the semiconductor device 30 can suppress degradation of transistor performance, and a highly reliable semiconductor device 30 can be provided.

Fourth Embodiment

In the present embodiment, an outline of a semiconductor device 40 according to one embodiment of the present invention will be described. One of the differences between the semiconductor device 40 and the semiconductor device 10 of the first embodiment is that wiring used for the silicon LSI (Large Scale Integration: large-scale integrated circuit) is used for the first gate electrode 404. Descriptions of the same or similar configurations as those of the first embodiment may be omitted.

[Structure of Semiconductor Device 40]

Figure 5:
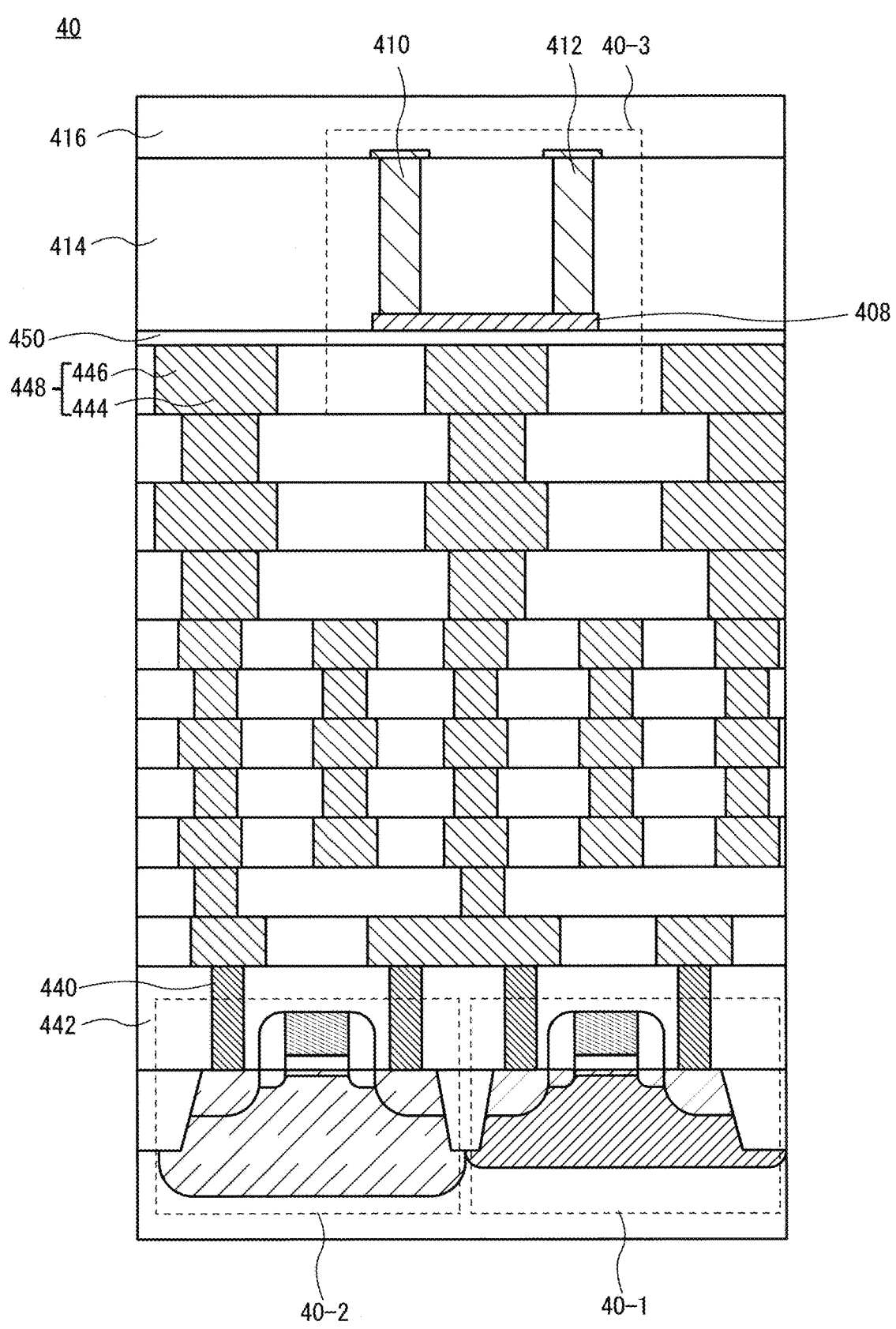
FIG. 5 is a schematic cross-sectional view of a semiconductor device according to an embodiment of the present invention.

FIG. 5 is a cross-sectional view illustrating an outline of a semiconductor device 40 according to an embodiment of the present invention. As shown in FIG. 5, semiconductor device 40 includes a substrate 400, an n-type MOS (metal-oxide-semiconductor) transistor 40-1, a p-type MOS transistor 40-2, a plug 440, an insulating film 442, an interlayer insulating film 444, a wiring 446, and a transistor 40-3 using the oxide semiconductor layer 408.

The substrate 400 is provided with the n-type MOS transistor 40-1 and the p-type MOS transistor The n-type MOS transistor 40-1 is provided with a gate electrode, a gate insulating film, a sidewall oxide film, an n-well, an n-channel (semiconductor layer), n-LDD (Lightly Doped Drain), and the like. The p-type MOS transistor 40-2 is provided with a gate electrode, a gate insulating film, a sidewall oxide film, a p-well, a p-channel (semiconductor layer), a p-LDD, and the like. Further, the plug 440 and the insulating film 442 are provided on the substrate 400. The plug 440 is electrically or directly connected to the n-type MOS transistor 40-1 and the p-type MOS transistor 40-2, respectively. The interlayer insulating film 444 and the wiring 446 are provided on the insulating film 442. The wiring 446 is electrically or directly connected to the plug 440. The layer 448 composed of the interlayer insulating film 444 and wiring 446 are stacked by a BEOL (Back End Of Line) process.

On the layer 448 composed of the insulating film 444 and wiring 446, the gate insulating film 450 is provided in contact with the wiring 446. On the gate insulating film 450, the oxide semiconductor layer 408 are provided so as to overlap the wiring 446. At this time, a part of the wiring 446 is a gate electrode that functions as a gate terminal of the transistor 40-3.

[Each Member Configuring Semiconductor Device 40]

The substrate 400 includes silicon, and a silicon wafer is preferably used. Since the n-type MOS transistor 40-1 and the p-type MOS transistor are formed near the front face of the substrate 400, a semiconductor layer (a channel) also includes silicon.

Tungsten (W) can be used for the plug 440. The wiring 446 may be made of the same material/structure as the first gate electrode 404, but is preferably made of a Cu containing Mn. As a result, the wiring 446 can have a self-passivation function in which manganese oxide is formed between SiO2 of the gate insulating film 450 provided in contact, and Cu is suppressed from diffusing into the gate insulating film 450.

As described above, in the semiconductor device 40 according to the embodiment of the present invention, manganese oxide is formed between the wiring 446 and gate insulating film 450 by using Cu containing Mn for the wiring 446 used for the silicon LSI and using a part of the wiring 446 as a gate electrode of the transistor 40-3 having the oxide semiconductor layer 408. As a result, Cu in the wiring 446 is suppressed from diffusing into the gate insulating film 450, and the transistor 40-3 can be suppressed from deteriorating.

As described above, according to the present embodiment, the highly reliable semiconductor device 40 is provided.

Fifth Embodiment

In the present embodiment, an outline of a display device 50 including the semiconductor device 10 according to one embodiment of the present invention will be described. Descriptions of configurations the same as or similar to those described in the first embodiment may be omitted.
[Structure of Display Device 50]

Figure 6:
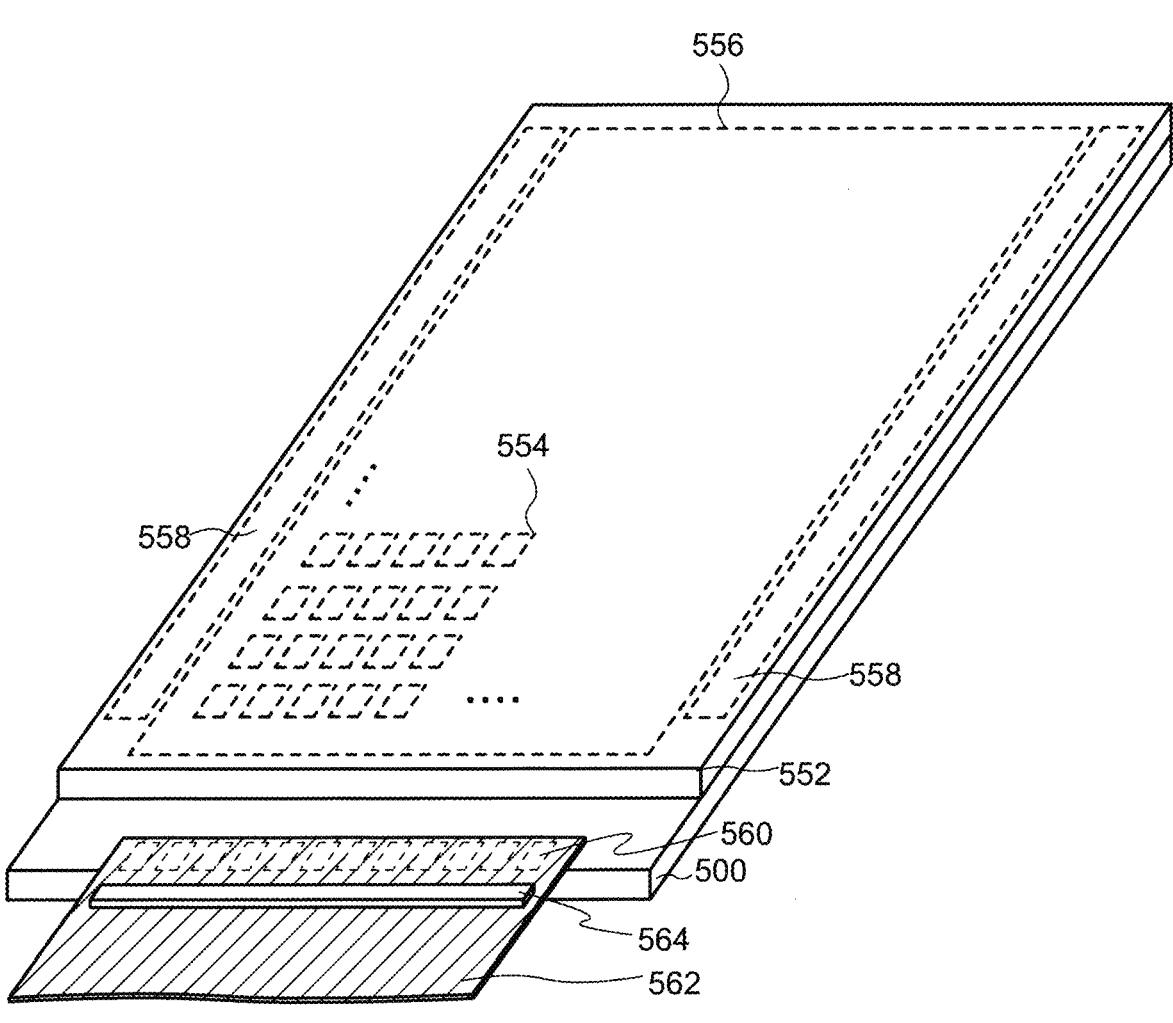
FIG. 6 is a schematic perspective view of a display device according to an embodiment of the present invention.

A schematic perspective view of the display device 50 is shown in FIG. 6. The display device 50 has the substrate 500 and the counter substrate 552 opposite the substrate 500, and the substrate 500 is provided with the plurality of pixels 554. The area in which the plurality of pixels 554 are arranged is the display area 556, and the scanning line driving circuit 558 for controlling the pixels 554 is provided on the substrate 500 on the outer side (peripheral area) of the display area 556. The counter substrate 552 is arranged on the pixels 554 and the scanning line driving circuit 558 so as to protect them. From the display area 556 and scanning line driving circuit 558, wirings (not shown) extend to one side of the substrate 500 and are exposed at an end portion of the substrate 500 to form the terminal 560. The terminal 560 is electrically connected to the flexible printed circuit board (FPC) 562, and the driver IC 564 for controlling the pixels 554 may be mounted on the FPC 562. The driver IC 564 may not be provided on the FPC 562 but may be mounted on the substrate 500, and instead of the driver IC 564 or together with the driver signal line driving circuit may be formed on the substrate 500. Here, the substrate 500 corresponds to the substrate 100 of the first embodiment.

Each of the pixels 554 is provided with a display element and pixel circuits for controlling the display element. Pixel circuits include various elements such as transistors and capacity elements, and are controlled by signals supplied from external circuits (not shown) via the scanning line driving circuit 558, the driver IC 564, and/or signal line driving circuit. Images are displayed on the display area 556 by light emission obtained from a display element or controlled by optical pixel circuitry obtained via a display element. Although the configuration of the pixel circuit is optional, at least one semiconductor device 10 described in the first embodiment is provided in each pixel circuit. The configuration of the display element may also be arbitrarily selected, and may be, for example, a light emitting element, a liquid crystal device, an electrophoretic device, or the like.

As described above, according to the present embodiment, the display device 50 in which the on-state current of the transistor is improved is provided. According to the present embodiment, the display device 50 in which the time-constant of wiring from the output terminal of the transistor is reduced is provided.

Each of the embodiments described above as the embodiment of the present invention can be appropriately combined as long as they are not mutually contradictory. A person skilled in the art, based on each embodiment, can appropriately add, delete, or make changes in design of the constituent elements, or add, omit, or make changes in conditions of the steps and such changes are also included in the scope of the present invention as long as the subject matter of the present invention is provided.

It is to be understood that the present invention provides other operational effects that are different from the operational effects provided by the aspects of the above-described embodiments, and those that are obvious from the description of the present specification or that can be easily predicted by a person skilled in the art.

What is claimed is:

1. A semiconductor device comprising:
   a first gate electrode;
   a first gate insulating film in contact with the first gate electrode;
   an oxide semiconductor layer in contact with the first gate insulating film; and
   a source electrode and a drain electrode electrically connected to the oxide semiconductor layer,
   wherein
   the source electrode and the drain electrode are either an electrode consisting of copper (Cu) containing manganese (Mn), an electrode having a layered structure of layers containing copper and titanium (Ti), or an electrode having a layered structure of layers containing titanium and aluminum (Al), and
   the first gate electrode includes a hydrogen-absorbing alloy including at least one selected from palladium (Pd) and Vanadium (V).

2. The semiconductor device according to claim 1, further comprising,
   electrode pads between the source electrode and the drain electrode and the oxide semiconductor layer, respectively,
   wherein:
   the source electrode and the drain electrode include titanium and aluminum, and
   a thickness of the source electrode and the drain electrode is greater than a thickness of the electrode pads.

3. The semiconductor device according to claim 1,
   wherein:
   the source electrode and the drain electrode have a layered structure of two or more layers,
   the layered structure has a first layer closest to the oxide semiconductor layer and a second layer farthest from the oxide semiconductor layer, and
   a thickness of the first layer is greater than a thickness of the second layer.

4. The semiconductor device according to claim 3,
   wherein:
   the layered structure has a third layer between the first layer and the second layer, the first layer and the second layer include titanium, and the third layer contains aluminum.

5. The semiconductor device according to claim 1, further comprising, a first insulating film in contact with the oxide semiconductor layer, wherein the first insulating film contains silicon oxide.

6. The semiconductor device according to claim 5, further comprising, a second insulating film in contact with the first insulating film, wherein a film density of the second insulating film is smaller than a film density of the first insulating film.

7. The semiconductor device according to claim 5, further comprising, a semiconductor layer containing silicon;

a second gate electrode overlapping the semiconductor layer, and a second insulating film in contact with the first insulating film, wherein:

the first gate electrode and the second gate electrode are located on the same layer, the oxide semiconductor layer is arranged on an upper layer than the semiconductor layer, and a film density of the second insulating film is greater than a film density of the first insulating film.

8. The semiconductor device according to claim 7, wherein the second insulating film contains silicon nitride.

9. A semiconductor device comprising:

a first gate electrode;

a first gate insulating layer covering the first gate electrode;

an oxide semiconductor layer on the first gate insulating layer;

a second gate insulating layer covering the oxide semiconductor layer;

a second gate electrode on the second gate insulating layer; and a source electrode and a drain electrode electrically connected to the oxide semiconductor layer, wherein each of the first gate electrode and the second gate electrode includes a hydrogen-absorbing alloy including at least one selected from palladium (Pd) and Vanadium (V).

10. The semiconductor device according to claim 9, wherein:

at least one of the source electrode and the drain electrode has a layered structure of two or more layers, the layered structure has a first layer closest to the oxide semiconductor layer and a second layer farthest from the oxide semiconductor layer, and a thickness of the first layer is greater than a thickness of the second layer.

11. The semiconductor device according to claim 9, wherein:

the layered structure has a third layer between the first layer and the second layer, the first layer and the second layer contain titanium, and the third layer contains aluminum.

12. The semiconductor device according to claim 9, further comprising, electrode pads between the source electrode and the drain electrode and the oxide semiconductor layer, respectively, wherein:

the source electrode and the drain electrode include titanium and aluminum, and a thickness of the source electrode and the drain electrode is greater than a thickness of the electrode pads.

13. The semiconductor device according to claim 9, further comprising, a semiconductor layer containing silicon, and a wiring electrically connected to the semiconductor layer, wherein:

the oxide semiconductor layer is arranged on an upper layer than the semiconductor layer, a part of the wiring is the first gate electrode, and the wiring consists of copper containing manganese (Mn).

14. The semiconductor device according to claim 9, further comprising, a first insulating film in contact with the second gate electrode and the second gate insulating film, wherein first insulating film contains silicon oxide.

15. The semiconductor device according to claim 14, further comprising, a second insulating film in contact with the first insulating film, wherein a film density of the second insulating film is smaller than a film density of the first insulating film.

16. The semiconductor device according to claim 15, further comprising, a third insulating film in contact with the first gate electrode, and a fourth insulating film in contact with the third insulating film, wherein a film density of the fourth insulating film is smaller than a film density of the third insulating film.

17. The semiconductor device according to claim 16, further comprising, a semiconductor layer containing silicon, wherein the third insulating film is arranged between the semiconductor layer and the first gate insulating film.

* * * * *